(12) United States Patent
Salter et al.

(10) Patent No.: US 11,437,895 B2
(45) Date of Patent: Sep. 6, 2022

(54) POWER SYSTEMS (71) Applicant: GE Energy Power Conversion Technology Ltd, Warwickshire (GB)

(72) Inventors: Benjamin Guy Salter, Rugby (GB); Martin Samuel Butcher, Rugby (GB)

(73) Assignee: GE ENERGY POWER CONVERSION TECHNOLOGY LIMITED, Rugby (GB)

( * ) Notice: Subject to any disclaimer, the term of this patent is extended or adjusted under 35 U.S.C. 154(b) by 511 days.

(21) Appl. No.: 16/184,348

(22) Filed: Nov. 8, 2018

(65) Prior Publication Data

US 2019/0140527 A1 May 9, 2019

(30) Foreign Application Priority Data

Nov. 8, 2017 (GB) .................................. 1718448.2

(51) Int. Cl.
| | |
|---|---|
| *H02K 11/40* | (2016.01) |
| *H02K 11/02* | (2016.01) |
| *H02K 1/18* | (2006.01) |
| *H02P 29/024* | (2016.01) |
| *H02K 11/01* | (2016.01) |
| *H02K 11/33* | (2016.01) |
| *H02K 5/22* | (2006.01) |
| *H02K 5/24* | (2006.01) |
| *H03H 7/06* | (2006.01) |

(52) U.S. Cl.
CPC .............. *H02K 11/40* (2016.01); *H02K 1/185* (2013.01); *H02K 5/225* (2013.01); *H02K 5/24* (2013.01); *H02K 11/0141* (2020.08); *H02K 11/02* (2013.01); *H02K 11/33* (2016.01); *H02P 29/0241* (2016.02); *H03H 7/06* (2013.01)

(58) Field of Classification Search
CPC ........... H02K 11/40; H02K 5/24; H02K 11/00
See application file for complete search history.

(56) References Cited

U.S. PATENT DOCUMENTS

| | | | | |
|---|---|---|---|---|
| 4,382,199 A | * | 5/1983 | Isaacson | A61M 60/43 310/87 |
| 4,689,546 A | * | 8/1987 | Stephens | G01R 15/181 322/99 |

(Continued)

FOREIGN PATENT DOCUMENTS

| | | |
|---|---|---|
| JP | 2001037139 A | 7/1999 |
| JP | 2007185020 A | 1/2006 |

OTHER PUBLICATIONS

Great Britain Search Report and Written Opinion dated May 4, 2018 which was issued in connection with Great Britian patent No. 1718448.2 which was filed on Nov. 8, 2017.

*Primary Examiner* — Alexander Talpalatski
(74) *Attorney, Agent, or Firm* — Wood IP LLC (57) ABSTRACT

The invention relates to a power system that includes an electrical machine, (e.g., a motor or generator). The electrical machine has a stator with a stator winding connected to a power converter. The power system includes an assembly to reduce, and optionally eliminate, common mode currents between the electrical machine and the power converter. The assembly includes a stator frame connected to ground potential and an electrical insulator (e.g., a plurality of stator mounts) located between the stator frame and the stator.

7 Claims, 4 Drawing Sheets

(56) References Cited

U.S. PATENT DOCUMENTS

| | | | | |
|---|---|---|---|---|
| 5,521,448 | A * | 5/1996 | Tecza | F16C 27/06 |
| | | | | 310/51 |
| 6,756,712 | B1 * | 6/2004 | Schuren | H02K 3/345 |
| | | | | 310/71 |
| 7,061,147 | B2 * | 6/2006 | Ries | H02K 1/30 |
| | | | | 310/54 |
| 9,413,204 | B2 * | 8/2016 | Ota | F04C 23/008 |
| 9,812,935 | B2 * | 11/2017 | Klopp | H02K 11/40 |
| 2003/0131462 | A1 | 7/2003 | Kimmel et al. | |
| 2013/0257207 | A1 * | 10/2013 | Nemoto | B60L 15/20 |
| | | | | 310/91 |
| 2016/0322880 | A1 * | 11/2016 | Bradley | H02K 1/148 |
| 2019/0190352 | A1 * | 6/2019 | Miyaji | H02K 11/0141 |
| 2019/0356191 | A1 * | 11/2019 | Simonsen | H02K 11/00 |
| 2020/0177050 | A1 * | 6/2020 | Jiwariyavej | H02K 5/20 |

* cited by examiner

POWER SYSTEMS

TECHNICAL FIELD

The invention relates to power systems, and in particular to power systems that include an electrical machine (e.g., a motor or generator) connected to a power converter and which suffer from electromagnetic (EM) emissions or interference caused by common mode currents.

BACKGROUND

It is known that connecting the stator winding of an electrical machine (e.g., a motor or generator) to a power converter that utilises power semiconductor devices will typically result in the generation of unwanted common mode currents. The power converter can be a variable speed drive, for example, and include a first converter with AC terminals connected to the electrical machine and a second converter with AC terminals connected to a power circuit. Respective DC terminals of the first and second converters are connected together by a DC link. The power circuit that is connected to the second converter might include a power supply or electrical load, for example. If the electrical machine is operating as a motor, power can be supplied from the power source to the motor through the power converter. In this case, the second converter will operate as a rectifier to supply power from the power source to the DC link and the first converter will operate as an inverter to supply power from the DC link to the motor. Typically, the first converter can be controlled to provide power to the motor at variable voltage and/or variable frequency. If the electrical machine is operating as a generator, generated power can be supplied from the generator to the electrical load through the power converter. In this case the first converter will operate as a rectifier to supply generated power from the generator to the DC link and the second power converter will operate as an inverter to supply power from the DC link to the electrical load.

During normal operation of the power converter, the power semiconductor devices in the first converter (or machine bridge) are switched on and off according to a particular firing pattern (e.g., a pulse width modulation (PWM) pattern) such that the phases of the stator winding are connected to one of the DC rails of the DC link. In a normal firing pattern, there will be times when all of the phases of the stator winding are simultaneously connected to one of the DC rails and times when all of the phases of the stator winding are simultaneously connected to the other DC rail. The phases of the stator winding therefore "swing" between the voltages of the DC rails.

The DC rails are at significantly different voltage levels and are referenced to a ground potential, either deliberately through a defined impedance or by a non-designed conduction path which may be referred to as stray capacitance.

The stator winding of the electrical machine typically includes a plurality of conductors formed of a copper material and received in axially-extending slots in the stator. The stator itself is formed of a plurality of steel laminations stacked together in the axial direction. The conductors of the stator winding are insulated from the adjacent stator core by suitable slot insulation. This structural arrangement can therefore be considered in terms of two electrical conductors (i.e., the stator and the stator winding), each defining a significant area, that are in close proximity to each other and separated by an insulation layer.

The stator is normally at ground potential. (For example, the stator may be fixed to a stator frame which is itself connected to ground for safety reasons. The method of fixing may provide an electrical connection between the stator and the stator frame, so that they are both at ground potential, or a deliberate ground connection may be made between them.) However, for the reasons explained above, the potential of the stator winding will vary as a result of the firing pattern. The result is stray capacitance between the stator winding and the stator (or machine leakage capacitance), and hence the circulation of common mode current between the stator and the power converter.

As used herein, the term "common mode current" refers to the current component flowing in the power circuit(s) of the source, power converter, electrical machine and ground plane due to the influence of common mode voltage (primarily created by the switching pattern of the power converter) upon the intentional and parasitic impedances between the power circuit(s) and ground.

Common mode currents are undesirable for several reasons, but in particular because they give rise to both radiated and conducted electromagnetic (EM) emissions or interference which can have a detrimental impact on parallel connected consumers, nearby systems, and may also falsely trigger ground fault detection systems.

One known way of reducing common mode currents is to introduce a common mode impedance between the power converter and the electrical machine. But such a common mode impedance must be rated to carry the full fundamental current of the electrical machine and is therefore physically large and expensive to implement in practice. Another way of reducing conducted common mode emissions into the power source is to provide a common mode filter between the power converter and the power circuit and reduce its impedance to ground. But this has the disadvantage of increasing the common mode currents flowing within the power converter and the electrical machine, and enabling an increased current to flow in the event of a ground fault elsewhere in the power system. In particular, the common mode filter can provide a low impedance path for circulation of the ground fault currents and, if multiple power converters are present, fault currents in excess of fire safety levels might occur.

Accordingly, there is a need for an alternative way of significantly reducing, and substantially eliminating, common mode currents in a power system.

SUMMARY OF THE INVENTION

The present invention provides a power system including:
a. an electrical machine (e.g., a motor or generator) including a stator with a stator winding connected to a power converter; and
b. an assembly to reduce, and optionally substantially eliminate, common mode currents between the electrical machine and the power converter, the assembly comprising a stator frame connected to ground potential and an electrical insulator located between the stator frame and the stator.

In the absence of an optional impedance connection between the stator and the stator frame—see below—the stator is completely electrically isolated from the stator frame. This has the effect of substantially eliminating any capacitance to ground of the electrical machine, thereby substantially eliminating circulating common mode currents between the electrical machine and the power converter.

The electrical machine can be of any suitable type, i.e., induction, synchronous, permanent magnet etc. and can include a rotor that is spaced apart from the stator by a radial air gap.

The stator winding can have any suitable number of phases, but three would be typical.

The stator winding can be a distributed stator winding wherein the conductors are typically received in axially-extending stator slots provided in a surface of the stator.

The power converter can include a first converter (or machine bridge) with AC terminals connected to the stator winding of the electrical machine. Each phase of the stator winding can be connected to a corresponding AC terminal of the first converter by a suitable AC connection. The first converter can have DC terminals. The DC terminals can be connectable to an external power circuit, e.g., directly to an external DC power circuit or indirectly to an external AC power circuit by means of a second converter. The second converter can have AC terminals connectable to the external AC power circuit, and DC terminals. The DC terminals of the first and second converters can be connected by a DC link, optionally including one or more DC link capacitors.

Each converter can have any suitable topology (e.g., two-level, three-level, multi-level etc.) and utilise any suitable power semiconductor devices that are controlled using any suitable firing pattern such as a pulse width modulation (PWM) firing pattern, for example.

It will be readily appreciated that the external power circuit does not form part of the power system per se but can include a power source or an electrical load. The external power circuit can be a supply grid or bus. The connection between the power converter and the external power circuit can include one or more additional components such as a filter (e.g., a PWM filter or common mode filter), protective switchgear or circuit breaker, transformer etc. The external power circuit can be an AC power circuit or a DC power circuit and any additional components, power source, electrical load etc. will be configured accordingly.

The stator frame can have any suitable construction and can be formed of any suitable material, e.g., steel. Typically, the stator frame is fixed to an external support or mounting for stability.

The electrical insulator between the stator and the stator frame can have any suitable construction. In one arrangement, the electrical insulator comprises one or more electrically insulating components or structures that space the stator apart from the stator frame. The components can be formed from any suitable insulating material.

In a specific arrangement, the electrical insulator comprises one or more stator mounts. The stator experiences dynamic forces during normal operation caused by, for example, the rotation of the rotor, the rotating magnetic field and time harmonics present in the stator current etc. Stator mounts are typically provided to reduce the transmission of these dynamic forces to the stator frame where they can cause unwanted noise and vibration. Unexpectedly, it has been found that such stator mounts can also be used to provide sufficient electrical isolation between the stator and the stator frame for the purpose of reducing common mode currents. A plurality of stator mounts can be located between the stator and the stator frame at circumferentially-spaced mounting locations around the stator. The stator is only physically connected to the stator frame through the one or more stator mounts and the majority of the stator and the stator frame remain physically separated by a gap created by the interposing stator mounts.

Each stator mount can be a "sandwich-type" anti-vibration mount with a plurality of elastomeric layers interleaved with rigid plates. Each stator mount can have a compression axis that is substantially normal to the plane of the various elastomeric layers and interleaved rigid plates, and a shear axes that is substantially parallel to the plane of the various elastomeric layers and interleaved rigid plates. Each stator mount will be located such that its compression axis is aligned substantially with a tangent of the stator and one of its shear axes is aligned substantially with a radius of the stator, optionally with the geometric centre of the stator.

The mounting locations may be evenly or unevenly spaced around the stator circumference depending on the design of the electrical machine and/or the support structure. In a typical support structure, the stator may be secured to the external stator frame at two, three or four spaced mounting locations, each of which has at least one stator mount.

A pair of stator mounts can be co-located at each mounting location and can have the same or different construction, including stiffness characteristics.

The elastomeric layers may be made of any suitable material such as rubber, rubber mix or polymer, for example. Similarly, the rigid plates may be made of a suitable material, although a rigid plate metal such as steel will generally be preferred. The materials selected for each stator mount must provide the required electrical insulation between the stator and the stator frame. The required level of insulation is dependent on a number of factors. These include, for example, the maximum DC link voltage, the peak line voltage of the AC network, the peak phase voltage offset induced by a ground fault on the AC network, the impedance of the stator winding to the stator core, the impedance across the stator mount, and the effect of any impedance network introduced between the stator core and the frame.

The elastomeric layers and interleaved rigid plates can be located between rigid end support members. One of the end support members can be used to locate the stator mount to a part of the stator while the other end support member can be used to locate the stator mount to the external stator frame. In this way, the stator is effectively physically decoupled from the stator frame and it is only indirectly connected to it by means of the stator mount. The stator is also electrically isolated from the stator frame by the stator mounts and the means of fixing or securing must be selected appropriately. The rigid end support members can be mechanically secured to the stator and stator frame using any suitable fixing such as bolts, for example, or may simply be positioned in or against a suitably shaped and sized seating provided at the stator and stator frame, respectively. Care must be taken when designing each stator mount to avoid risk of potential discharge between electrically conducting components that are at the stator potential and the stator frame (or ground) potential. This means that consideration must be given, not only to the size of any airgap but also to the shape of the conductors in order to avoid a concentrated electric field. For example, plain shank bolts can be used instead of threaded shank bolts to increase the partial discharge level. Clearance between the stator and the stator frame should also be designed to accommodate the maximum physical displacement due to relative movement between the stator and the stator frame, and achieve the required creepage and clearance between the stator and the stator frame.

The power system can further comprise an impedance connection between the stator frame and the stator. As used herein, the term "impedance connection" refers to a deliberate electrical connection between the stator core and stator frame used to control the distribution of common mode voltage between the stator winding, the stator core, and the stator frame.

As described in more detail below, the impedance connection can include a suitable filter, e.g., a parallel RC filter. The impedance connection can be electrically connected between the stator and the stator frame adjacent to a stator mount or other electrical insulator or component. The physical component(s) providing the impedance connection (e.g., electrical lead or cable) is/are as short as possible to minimise any associated stray inductances which could limit filter high frequency effectiveness. The filter might typically be mounted to the stator frame so that, in the case where the electrical insulator comprises one or more stator mounts, the filter components are decoupled from stator vibration. If the electrical machine is air-cooled, the air cooling path typically extends axially along the air gap, with cooling air entering from one or both axial ends of the stator. The filter can be mounted so that it is cooled by the air cooling path of the electrical machine, or at least mounted so that it is not subject to additional heating caused by heated air exiting from the stator. Such additional heating would have an adverse impact on the filter component rating and lifetime.

It will be readily appreciated that, when compared to complete electrical isolation of the stator frame, the introduction of an impedance connection between the stator and the stator frame will not lead to the complete elimination of common mode currents. But the impedance connection can have other practical benefits and will allow common mode currents (and hence the resulting EM emissions and interference) to be properly controlled and significantly reduced when compared to conventional power systems.

The impedance connection only needs to be rated to carry the common mode currents not the full fundamental current of the electrical machine. The common mode currents are inherently low compared to the fundamental current and the function of the impedance connection is to make the common mode currents even smaller. This means that the optional impedance connection can utilise components that are physically small, lightweight and relatively cheap.

In one arrangement, the filter of the impedance connection includes a resistor and capacitor connected in parallel, i.e., it is a parallel RC filter. The filter can also include additional non-linear or tuned components such as a surge suppressor to avoid excessive voltage, an inductor for rejecting a particular frequency (e.g., the PWM frequency) etc. Because the stator is electrically isolated from the grounded stator frame, the filter can prevent the stator potential from reaching an unacceptably high level. The filter can also balance any voltage stress applied to the machine insulation versus the effectiveness of the stator isolation. The filter can include components to enable frequency-dependent optimisation with the aim of balancing decoupling of the leakage impedance at the dominant PWM frequencies (typically less than 20 times the PWM carrier frequency, since for a simple symmetrical square wave harmonic magnitude is proportional to 1/n) against the ability to effectively provide a defined path for smaller magnitude higher frequency leakage currents (typically in excess of 150 kHz) which become increasing difficult to isolate.

In one arrangement, the filter might support about 50% to about 80% of the applied common mode voltage, which implies that the capacitance of the filter capacitor would range from being approximately equal to the total machine leakage capacitance to about 20% of the total machine leakage capacitance. Considering the parallel RC filter case, the equivalent circuit of the stator and filter can be simplified to the machine stator leakage capacitance (3×Cs, for a three-phase machine) in series with the filter capacitance (Cf). For series capacitive elements, the applied common voltage (Vcm) is distributed across the winding (Vw) in inverse proportion to their capacitance.

From circuit analysis the following can be readily deduced:

$$\frac{Cf}{Cs} = \frac{1}{\frac{1}{3}\left(\frac{Vcm}{Vw} - 1\right)}$$

Therefore, if we wish to constrain the winding voltage to 20% of the applied common mode voltage:
a. Vcm=1
b. Vw=0.2

We can determine Cf with respect to Cs as follows by re-arranging the previous equation:

$$Cf = \frac{Cs}{\frac{1}{3}\left(\frac{Vcm}{Vw} - 1\right)}$$

$$Cf = 0.75 \cdot Cs$$

A damping resistor or other non-linear component can be included to ensure the safe discharge of the filter capacitor within a suitable time period (e.g., less than 5 minutes) and avoid incremental charging of the filter capacitor and stator frame with respect to ground.

The present invention further provides a power system comprising:
a. an electrical machine (e.g., a motor or generator) including a stator with a stator winding connected to a power converter; and
b. an assembly to reduce, and optionally substantially eliminate, common mode currents between the electrical machine and the power converter, the assembly comprising a stator frame connected to ground potential and electrically isolated from the stator, optionally by means of an electrical insulator located between the stator frame and the stator.

The electrical machine, power converter, stator frame, and electrical insulator can be as described above.

The power system can be for a marine vessel, e.g., a marine power distribution system where the electrical machine is an electric propulsion motor for driving a propulsion load. The power system can be a renewable energy power system, e.g., where the electrical machine is a wind turbine generator driven by a wind turbine assembly with one or more turbine blades.

The present invention provides a method of reducing, and optionally substantially eliminating, common mode currents in a power system comprising an electrical machine (e.g., a motor or generator) including a stator with a stator winding connected to a power converter, and a stator frame, the method comprising the steps of connecting the stator frame to ground potential and electrically isolating the stator from the stator frame.

The stator frame can be electrically isolated from the stator by locating an electrical insulator between the stator frame and the stator. The electrical machine, power converter, stator frame, and electrical insulator (e.g., one or more stator mounts) can be as described above.

DETAILED DESCRIPTION

Figure 1:
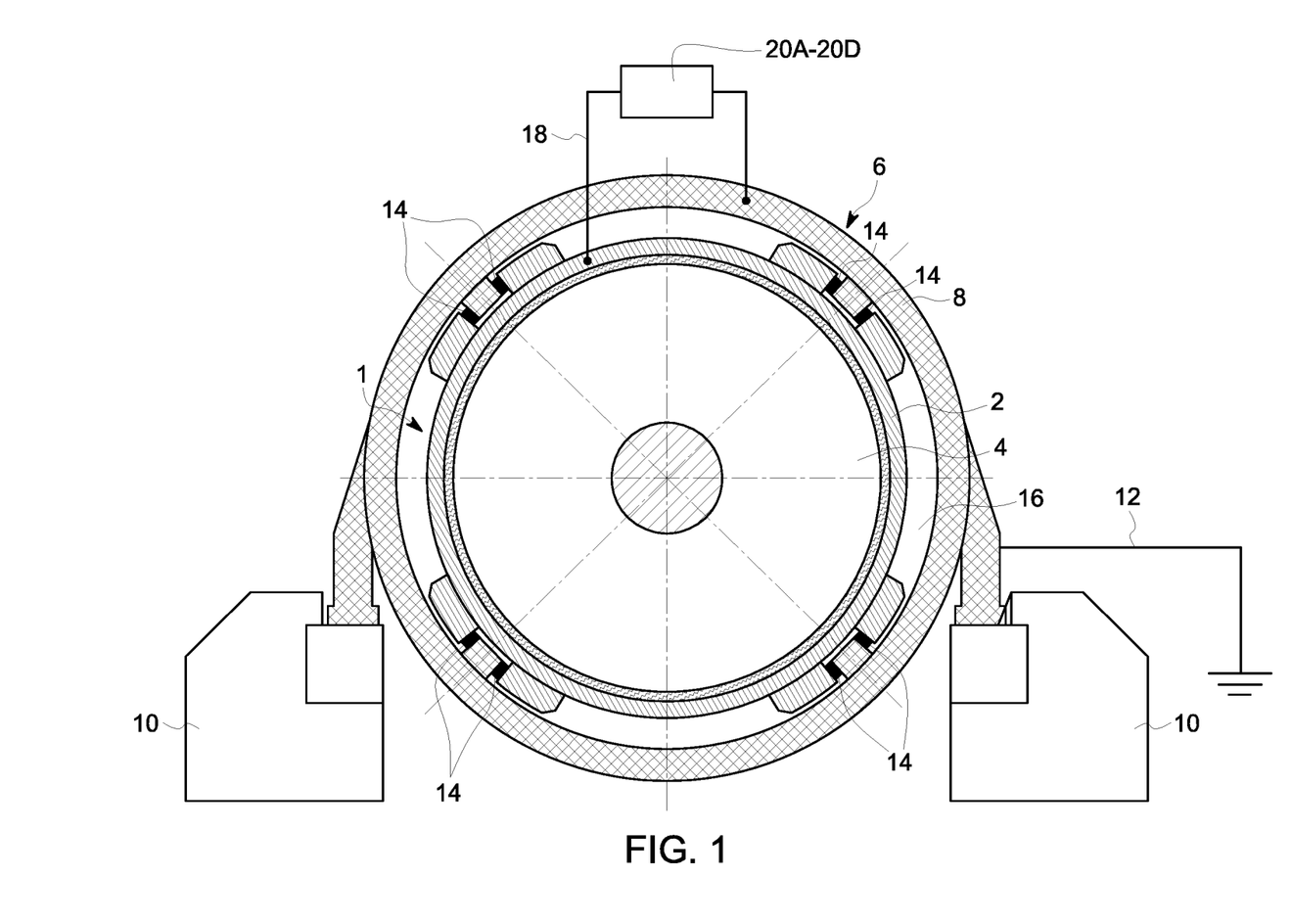
FIG. 1 is an end view of a first power system according to the present invention.

With reference to FIG. 1, a first power system includes an electrical machine 1 that includes a stator 2 and a rotor 4 spaced apart by a radial air gap. The electrical machine 1 can be a motor or generator, for example an electric propulsion motor for driving a propulsion load or a wind turbine generator driven by a wind turbine assembly with one or more turbine blades. The stator 2 includes a stator winding (not shown) that typically includes a plurality of conductors located in slots provided in the stator. The stator winding typically includes three phases, with each phase being connected to a power converter (not shown) in a known manner, e.g., as described in the Background Art.

The first power system includes an assembly 6 to reduce common mode currents between the electrical machine 1 and the power converter (not shown). The assembly 6 includes an external stator frame 8 that surrounds the stator 2. The stator frame 8 is physically supported on mountings 10 and is connected to ground potential by means of a ground connection 12.

The stator 2 is electrically isolated from the stator frame 8 by a plurality of stator mounts 14. The stator mounts 14 also reduce the transmission of dynamic forces experienced by the stator during normal operation to the stator frame 8. A pair of stator mounts 14 are co-located between the stator 2 and the stator frame 8 at circumferentially-spaced mounting locations around the stator at both the drive and non-drive ends. The stator 2 is only physically connected to the stator frame 8 through the one or more stator mounts and the majority of the stator and the stator frame remain physically separated by a gap 16 created by the interposing stator mounts. Each stator mount 14 is a "sandwich-type" anti-vibration mount with a plurality of elastomeric layers interleaved with rigid plates as described in more detail above.

Optionally, the stator 2 is electrically connected to the stator frame 8 by an impedance connection 18 that includes a filter circuit 20A, 20B, 20C or 20D as shown in FIGS. 4, 5, 6 and 7, respectively.

Figure 2:
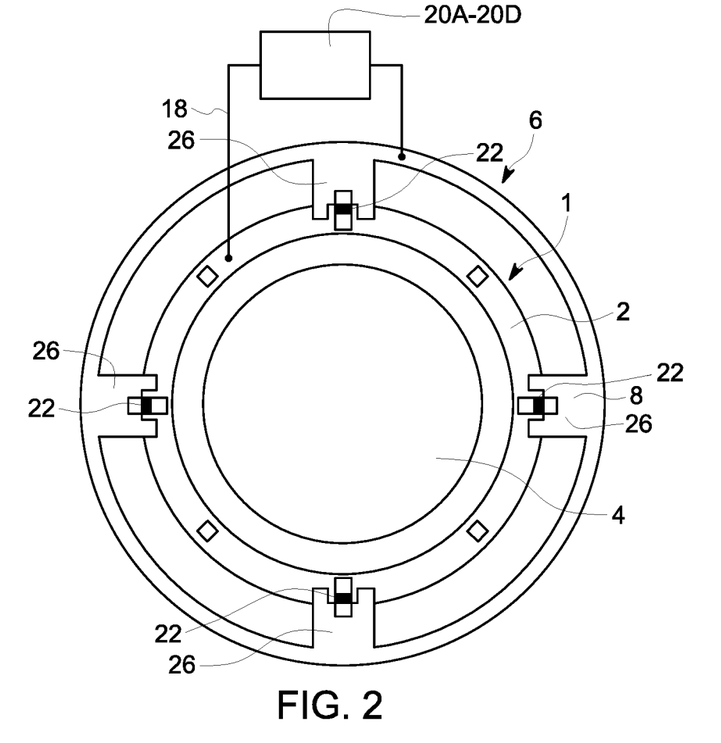
FIG. 2 is an end view of a second power system according to the present invention.
Figure 3:
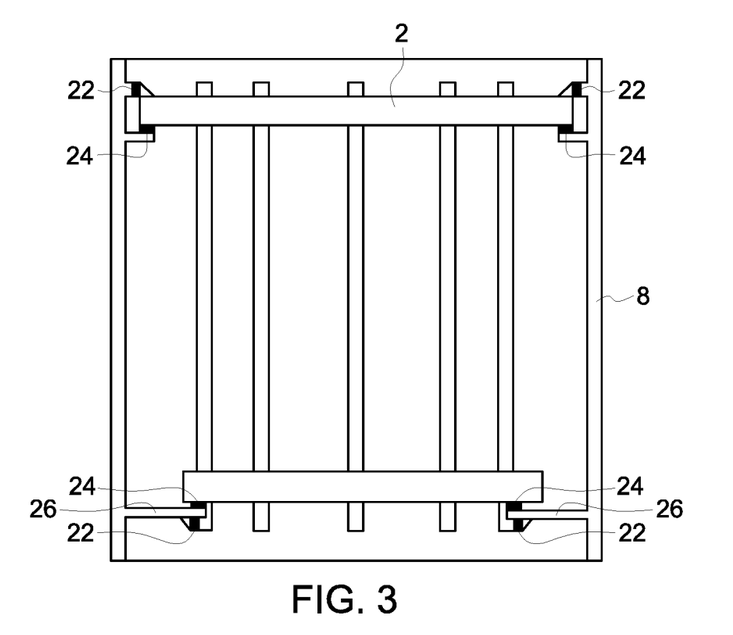
FIG. 3 is a side view of the second power system.

A second power system is shown in FIGS. 2 and 3. Components that are common to the first power system have the same reference sign. The assembly uses insulating components instead of the stator mounts of the first power system to electrically isolate the stator 2 from the stator frame 8. The insulating components are provided at circumferentially-spaced mounting locations around the stator at both the drive and non-drive ends. First insulating components 22 provide insulation in a radial direction between the stator 2 and the stator frame 8. Second insulating components 24 provide insulation in an axial direction between the stator 2 and the stator frame 8. The insulating components can be formed of a glass fibre reinforced resin, for example.

FIG. 2 shows the non-drive end of the electrical machine 1 where the stator frame 8 includes fixing brackets 28.

FIGS. 4 to 7 show four different filter circuits for the impedance connection 18 between the stator 2 and the stator frame 8. It will be readily appreciated by the skilled person that other filter circuits suitable can be used to achieve the stated aims.

Figure 4:
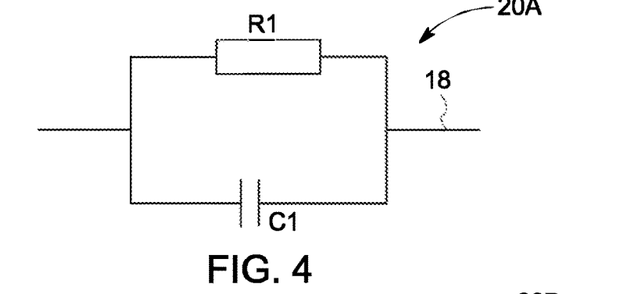
FIG. 4 is a first filter circuit.

A first filter circuit 20A shown in FIG. 4 includes a resistor R1 and a capacitor C1 connected in parallel, i.e., it is a parallel RC filter.

Figure 5:
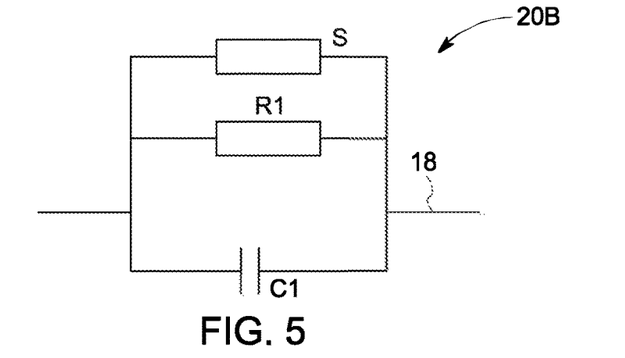
FIG. 5 is a second filter circuit.

A second filter circuit 20B shown in FIG. 5 includes a resistor R1, a capacitor C1, and a surge suppressor S connected in parallel. The surge suppressor S can provide clamping of the peak voltage.

Figure 6:
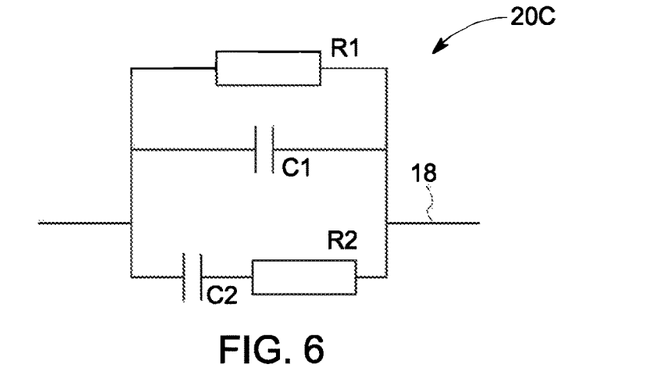
FIG. 6 is a third filter circuit.

A third filter circuit 20C shown in FIG. 6 includes a first resistor R1 and a first capacitor C1 connected in parallel. A series-connected second resistor R2 and second capacitor C2 are connected in parallel with the first resistor R1 and the first capacitor C1. The series-connected components R2 and C2 enable additional damping to be inserted into the common mode path.

Figure 7:
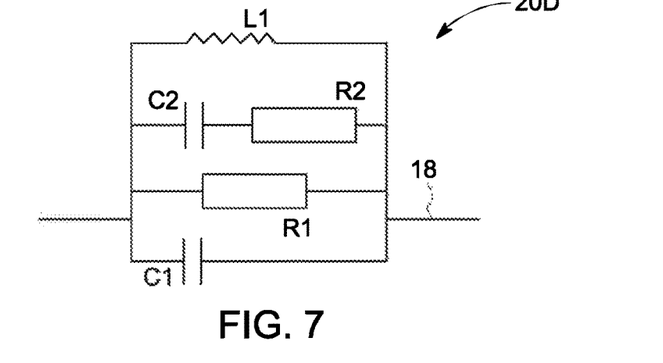
FIG. 7 is a fourth filter circuit.

A fourth filter circuit 20D shown in FIG. 7 includes a first resistor R1, a first capacitor C1, and an inductor L1 connected in parallel. A second resistor R2 is connected in series with a second capacitor C2. The series-connected components R2 and C2 enable additional damping to be inserted into the common mode path, and the inductor L1 creates a tuned circuit with the first and second capacitors C1 and C2 to increase the filter impedance at a target frequency (for example, the PWM switching frequency) enabling the rejection of common mode current at that frequency to be enhanced.

Considering the first filter circuit 20A, if Cs is the machine leakage (or stray) capacitance of each phase of the stator winding, a typical capacitance value of capacitor C1 might be about n×Cs, where n is the number of phases of the stator winding. This would divide the common mode voltage applied to the electrical machine substantially equally across the stator winding insulation and the stator mounts (or other insulating components) that are used to electrically isolate the stator 2 from the stator frame 8. The resistance value of resistor R1 would typically be selected to damp the resonant LC circuit formed by the machine leakage inductance, the machine leakage capacitance, and the filter capacitance to ensure the capacitor C1 is discharged. The balance between the machine leakage capacitance Cs and the capacitance value of capacitor C1 can be used to bias performance of the filter circuit either towards (a) a reduction in the ground leakage current (i.e., a lower capacitance to ground) which would increase voltage stress on the stator winding, or (b) a reduction in winding voltage stress which would increase ground leakage current.

Figure 8:
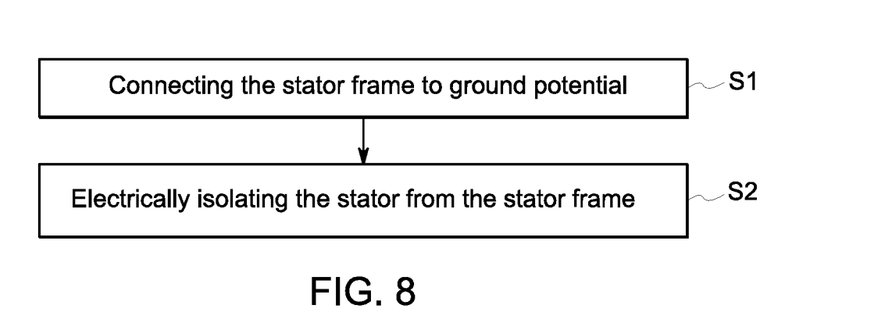
FIG. 8 is a flow diagram of the method according to the present invention.

A method of reducing, and optionally substantially eliminating, common mode currents in a power system is shown in FIG. 8. The power system is as described herein (e.g., with reference to FIGS. 1 to 3) and comprises an electrical machine including a stator with a stator winding connected to a power converter, and a stator frame. The method includes a first step S1 of connecting the stator frame to ground potential, and a second step S2 of electrically isolating the stator from the stator frame, e.g., by locating an electrical insulator between them.

What we claim is:

1. A power system comprising:
an electrical machine including a stator with a stator winding connected to a power converter;

an assembly to reduce common mode currents between the electrical machine and the power converter, the assembly comprising: (i) a stator frame connected to ground potential and (ii) an electrical insulator located between the stator frame and the stator; and an impedance connection between the stator frame and the stator, and including a filter having a first resistor and a first capacitor connected in parallel, wherein the electrical insulator comprises: a plurality of stator mounts at circumferentially-spaced mounting locations corresponding to a circumference of the stator, the plurality of stator mounts of the electrical insulator spaced apart from each other and interposing between the stator and the stator frame such that the stator is only physically connected to the stator frame through the plurality of stator mounts; and the stator and the stator frame are physically separated from each other by an airgap created by the plurality of stator mounts.

2. The power system according to claim 1, wherein each of the plurality of stator mounts is an anti-vibration mount with a plurality of elastomeric layers interleaved with rigid plates.

3. The power system according to claim 1, wherein the filter further includes a second resistor and a second capacitor connected in series, the series-connected second resistor and second capacitor being connected in parallel with the first resistor and the first capacitor.

4. The power system according to claim 1, wherein the filter further includes a surge suppressor connected in parallel with the first resistor and the first capacitor.

5. The power system according to claim 1, wherein the filter further includes an inductor connected in parallel with the first resistor and the first capacitor.

6. A power system comprising:
an electrical machine including a stator with a stator winding connected to a power converter;
an assembly to reduce common mode currents between the electrical machine and the power converter, the assembly comprising a stator frame connected to ground potential and physically and electrically isolated from the stator by a plurality of stator mounts at circumferentially-spaced mounting locations corresponding to a circumference of the stator; and an impedance connection between the stator frame and the stator, and including a filter having a first resistor and a first capacitor connected in parallel, wherein the plurality of stator mounts being spaced apart from each other and interposing between the stator and the stator frame such that the stator is only physically connected to the stator frame through the plurality of stator mounts; and the stator and the stator frame are physically separated by an airgap created by the plurality of stator mounts.

7. A method of reducing common mode currents in a power system comprising an electrical machine including a stator with a stator winding connected to a power converter, and a stator frame, the method comprising:

connecting the stator frame to ground potential and physically and electrically isolating the stator from the stator frame by a plurality of stator mounts at circumferentially-spaced mounting locations corresponding to a circumference of the stator, the plurality of stator mounts being spaced apart from each other and interposing between the stator and the stator frame such that the stator is only physically connected to the stator frame through the plurality of stator mounts; and the stator and the stator frame are physically separated by an airgap created by the plurality of stator mounts; and creating an impedance connection between the stator frame and the stator, including a filter having a first resistor and a first capacitor connected in parallel.

* * * * *